United States Patent [19]

Alberts

[11] 4,317,056
[45] Feb. 23, 1982

[54] VOLTAGE MONITORING AND INDICATING CIRCUIT

[75] Inventor: Steven L. Alberts, Kent, Wash.

[73] Assignee: GTE Products Corporation, Stamford, Conn.

[21] Appl. No.: 133,230

[22] Filed: Mar. 24, 1980

[51] Int. Cl.³ ................. H03K 5/153; G08B 21/00
[52] U.S. Cl. ..................................... 307/350; 307/64; 307/130; 307/296 R; 340/650; 340/652; 361/92
[58] Field of Search ............... 307/64, 103, 126, 130, 307/141.4, 350, 358, 296 R; 340/660, 663, 650, 652; 361/54, 56, 92

[56] References Cited
U.S. PATENT DOCUMENTS 3,189,788 6/1965 Cady ..................................... 307/64
3,364,365 1/1968 Eisenhauer .......................... 307/350
3,522,481 8/1970 Terzic ................................. 307/130

*Primary Examiner*—John Zazworsky
*Attorney, Agent, or Firm*—Peter Xiarhos

[57] ABSTRACT

A voltage monitoring and indicating circuit for producing an output pulse at an output terminal in response to the loss of a positive dc input voltage at an input terminal. A capacitor is charged during the presence of an input voltage at the input terminal, and a transistor coupled to the capacitor and to the output terminal operates in a non-conducting state so that no voltage pulse is produced by the transistor at the output terminal. In the event of a subsequent loss of the input voltage, the capacitor discharges into the transistor and causes the transistor to operate in a conducting state and a discharge path to be provided through the transistor for the capacitor. As the discharge takes place, an exponentially-decaying pulse is produced by the transistor at the output terminal. The components in the discharge path may take any one of a variety of forms to allow the circuit to produce an output pulse at the output terminal as a result of a loss of input voltage due to an open circuit condition or both an open circuit condition and a short circuit condition.

14 Claims, 6 Drawing Figures

VOLTAGE MONITORING AND INDICATING CIRCUIT

The invention herein described was made in the course of a contract with the Department of the Navy.

BACKGROUND OF THE INVENTION

The present invention relates to a monitoring and indicating circuit. More particularly, the invention is directed to a voltage monitoring and indicating circuit for monitoring a dc voltage utilized by a circuit or apparatus and for providing an output indication in the event of a loss of the voltage, for example, due to an open circuit condition or a short circuit condition.

There are many applications in which a circuit or apparatus is powered by a dc voltage and in which it is desired to detect a loss of this voltage, for example, due to an open circuit condition or a short circuit condition. The detection of the loss of voltage may be utilized in many different ways, such as initiating an alarm condition, generating a computer interrupt, automatically switching a standby dc voltage source to the circuit or apparatus, activating a so-called "crowbar" circuit to protect the circuit or apparatus from damage or improper operation, or acting as a short term power source itself.

BRIEF SUMMARY OF THE INVENTION

The present invention is directed to a voltage monitoring and indicating circuit which may be used for purposes as described hereinabove.

The voltage monitoring and indicating circuit in accordance with the invention includes an input terminal for receiving an input voltage, an output terminal, and a transistor means. The transistor means has a first electrode, a second electrode, and a third electrode coupled to the output terminal. The transistor means has a first conducting state during which no voltage is produced at its third electrode and at the output terminal and a second conducting state during which a voltage pulse is produced at its third electrode and at the output terminal.

The voltage monitoring and indicating circuit further includes a storage means coupled to the first electrode of the transistor means, and a circuit means coupled to the input terminal, to the storage means, and to the first and second electrodes of the transistor means. The circuit means operates when an input voltage is present at the input terminal to cause the storage means to be charged to a voltage and to cause the transistor means to operate in its first conducting state whereby no voltage is produced by the transistor means at its third electrode and at the output terminal. The storage means operates when it has been charged to a voltage by the circuit means, and in response to a subsequent loss of the input voltage at the input terminal, to discharge and to cause the transistor means to operate in its second conducting state, whereby an output pulse indicative of the loss of the input voltage is produced at the third electrode of the transistor means and at the output terminal. The circuit means in accordance with the invention as discussed hereinabove further includes a discharge means. This discharge means operates when the transistor means is in its second conducting state to provide a discharge path through the transistor means for the storage means. The output pulse produced by the transistor means is produced during the discharge of the storage means.

BRIEF DESCRIPTION OF THE DRAWING

Various objects, features and advantages of voltage monitoring and indicating circuits in accordance with the present invention will be had from a detailed discussion taken in conjunction with the accompanying drawing in which.

DETAILED DESCRIPTION OF THE INVENTION

Figure 1:
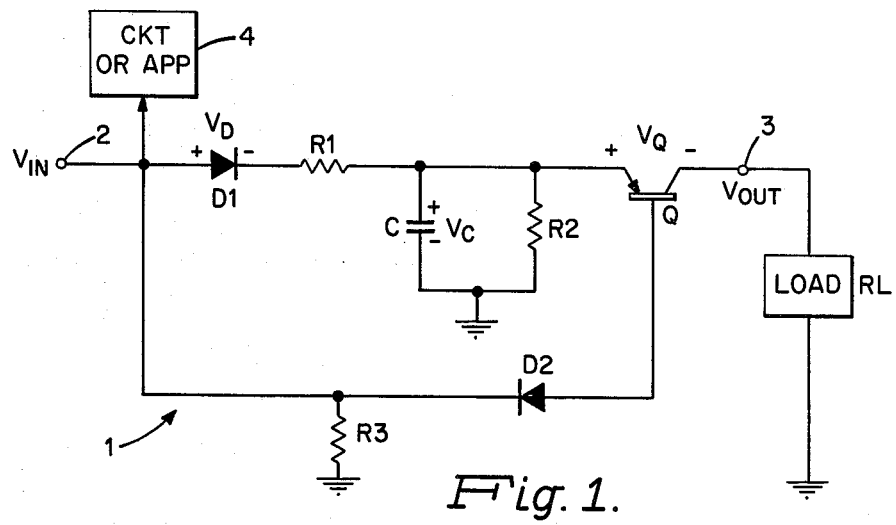
FIG. 1 is a schematic circuit diagram of a voltage monitoring and indicating circuit in accordance with a first embodiment of the invention for monitoring a dc voltage and for producing an output pulse upon the loss of the dc voltage due to an open circuit condition.
Figure 2:
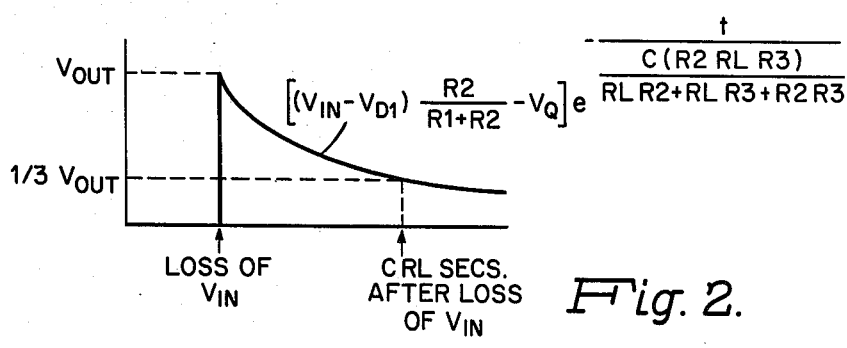
FIG. 2 illustrates the nature of an output pulse produced by the voltage monitoring and indicating circuit of FIG. 1.

Referring now to FIG. 1, there is shown a voltage monitoring and indicating circuit 1 in accordance with a first embodiment of the invention. The voltage monitoring and indicating circuit as shown in FIG. 1 is arranged to monitor a positive dc voltage $V_{IN}$ applied to an input terminal 2 and to produce an output dc voltage $V_{OUT}$ at an output terminal 3 upon a loss of the input dc voltage, specifically, as a result of an open circuit condition. The output voltage takes the form of a pulse as shown in FIG. 2 and is applied to a resistive load RL for utilization thereby as will be described in greater detail hereinafter. As indicated in FIG. 1, the dc voltage $V_{IN}$ at the input terminal 2 is also applied to a circuit or apparatus 4 for utilization thereby in any suitable or desired manner, for example, for powering the circuit or apparatus 4.

The voltage monitoring and indicating circuit as shown in FIG. 1 includes a pnp transistor Q. The emitter of the transistor Q is coupled to the input terminal 2 via a series arrangement of a diode D1 and a current-limiting resistance R1 and also to ground potential via a storage capacitance C and a resistance R2. The resistances R1 and R2 together form a voltage divider circuit. The base of the transistor Q is coupled to ground potential by means of a diode D2 and a resistance R3. The diode D2 and the aforementioned resistance R2 provides noise immunity for the circuit 1 in case of fluctuations in the voltage $V_{IN}$ at the input terminal 2. The juncture of the diode D2 and the resistance R3 is connected to the input terminal 2. The collector of the transistor Q is connected directly to the output terminal 3. In the circuit 1 as described hereinabove, the resistance R3 is chosen to have a value at least ten times that of the resistive load RL, and the resistance R2 is chosen to have a value substantially greater than that of the resistance R3. By way of a specific example, the resistances R1, R2, R3 and RL may have values of 1 Kohm, 9.1 Kohm, 1 Kohm, and 10 ohms, respectively, and the capacitance C may have a value of 33 mf. The diodes D1 and D2 may be of a type 1N4148 and the transistor Q may be of a type 2N2907A. The voltage $V_{IN}$ may have a value of +15 volts.

In the normal operation of the voltage monitoring and indicating circuit 1, that is, with the voltage $V_{IN}$ applied to the input terminal 2 and to the circuit or apparatus 4, a voltage $V_C$ is established across the capacitance C and also at the emitter of the transistor Q having a value expressed by $$V_C = (V_{IN} - V_{D1}) \frac{R2}{R1 + R2}, \quad (1)$$

where $V_{D1}$ is the voltage drop, typically 0.7 volts, across the diode D1. The capacitance C is charged to the value of the voltage $V_C$. At this particular time, the diode D2 is reverse biased to the voltage $V_{IN}$, and the base of the transistor Q is positive relative to the emitter so that the transistor Q is reverse biased into its non-conducting state. With the transistor Q in its non-conducting state, there is no voltage at the output terminal 3 or applied to the load RL.

In the event the voltage $V_{IN}$ at the input terminal 2 subsequently ceases, specifically, due to an open circuit condition at the input terminal 2, the capacitor C, which is charged to the aforementioned voltage $V_C$, discharges into the emitter of the transistor Q causing the voltage at the emitter to increase positively relative to the base. This is turn causes the transistor Q to be biased into its conducting state. The diode D1 prevents any reverse discharge of the capacitance C into the input terminal 2. With the transistor Q in its conducting state, a discharge path is provided to reference ground potential for the capacitance C via the conducting transistor Q, the diode D2, which becomes forward biased, and the resistance R3. At the same time, an output voltage pulse as shown in FIG. 2 is established at the output terminal 3 and applied to the load RL. This pulse has an instantaneous, maximum value at the time of the loss of the input voltage $V_{IN}$ expressed by $$V_{OUT} = \left( (V_{IN} - V_{D1}) \frac{R2}{R1 + R2} - V_Q \right) e^{-\frac{t}{C \frac{R2R3RL}{R1R2+R1R3+R2R3}}}, \quad (2)$$

where $V_Q$ is the emitter to collector voltage of the transistor Q. The output pulse decays exponentially and gradually from its maximum value $V_{OUT}$ and achieves a value equal to about one-third of its maximum value at a time expressed by $$t = C \frac{R2R3RL}{RLR2 + RLR3 + R2R3} \quad (3)$$

For the aforementioned values for the resistances R2 and R3, the exponential portion of the above expression (3) may be approximated by $$e^{-\frac{t}{CRL}} \quad (4)$$

The duration of the output pulse at the output terminal 3 is thus determined principally by the values of the capacitance C and the resistive load RL. The resistive load RL may use the output pulse in any suitable or desired manner, for example, to initiate an alarm condition, to generate a computer interrupt, to automatically switch a standby dc voltage source (which produces a voltage equal to $V_{IN}$) to the circuit or apparatus 4, to activate a "crowbar" circuit to protect the circuit or apparatus 4 from damage or improper operation, or to act as a short term power source itself.

Figure 3:
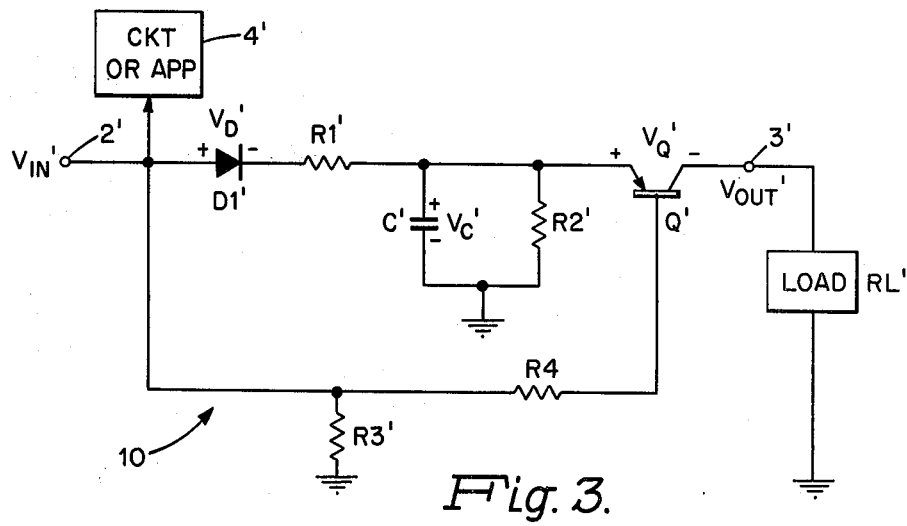
FIGS. 3 and 4 are schematic circuit diagrams of voltage monitoring and indicating circuits in accordance with second and third embodiments of the invention, respectively, for monitoring dc voltages and for producing output pulses upon the loss of the dc voltage due to either open circuit or short circuit conditions.
Figure 4:
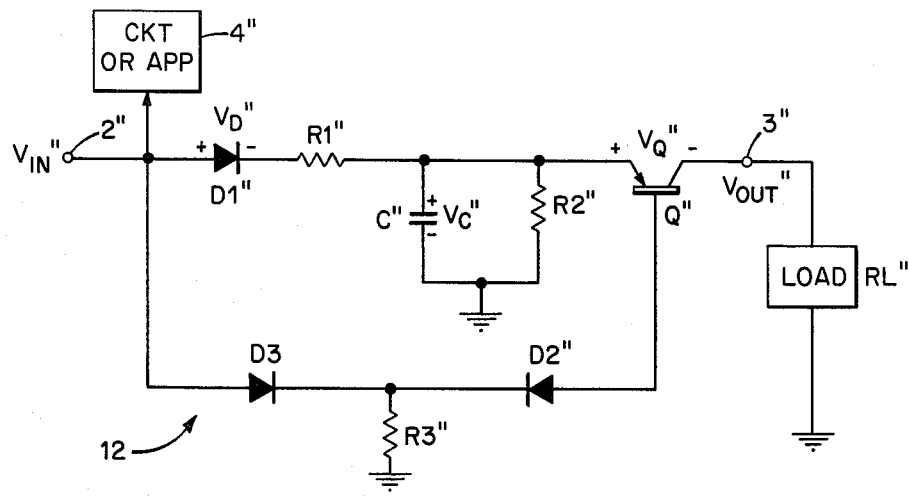

The voltage monitoring and indicating circuit 1 of FIG. 1 as described hereinabove is employed to detect the loss of a dc voltage $V_{IN}$ due to an open circuit condition and to provide an indication thereof at the output terminal 3. FIGS. 3 and 4 illustrate voltage and monitoring circuits 10 and 12, respectively, which are capable of detecting a loss of dc voltage either as a result of an open circuit condition or a short circuit condition. Many of the components and voltages utilized by the circuits 10 and 12 are like those of the abovedescribed circuit 1 and, for this reason, are shown primed (FIG. 3) or double primed (FIG. 4) in the drawing.

Figure 5:
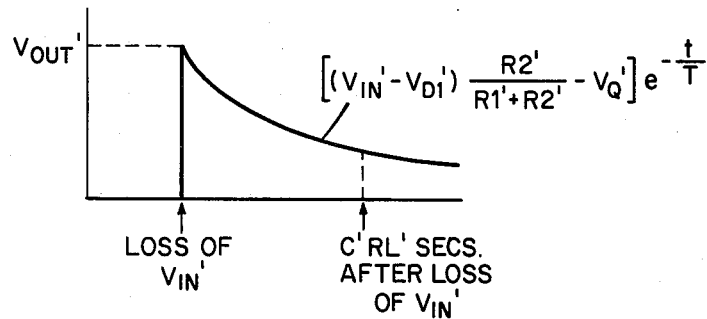
FIGS. 5 and 6 illustrate the nature of output pulses produced by the voltage monitoring and indicating circuits of FIGS. 3 and 4, respectively.

The voltage and monitoring circuit 10 as shown in FIG. 3 differs from the voltage and monitoring circuit 1 as shown in FIG. 1 in that it utilizes a current-limiting resistance R4 in place of the diode D2 in the discharge path for the capacitance C in the circuit 1. In the event of a loss of the input voltage $V_{IN}'$ due to an open circuit condition, the operation of the circuit 10 is essentially the same as that of the aforedescribed circuit 1 and an output pulse as shown in FIG. 5 is produced at the output terminal 3' having a maximum value $V_{OUT}'$ at the time of the loss of voltage expressed by $$V_{OUT}' = \left( (V_{IN} - V_{D1}) \frac{R2'}{R1' + R2'} - V_Q' \right) e^{-\frac{t}{T}}, \quad (5)$$

where $$T = C' \frac{RL'R2'(R4 + R3')}{RL'R2' + RL'(R4 + R3') + R2'(R4 + R3')}. \quad (6)$$

If the values of the resistances R2' and R4 are both very much larger than the value of resistive load RL', expression (6), supra, becomes approximately equal to C'RL', with the result that the duration of the output pulse at the output terminal 3' is essentially determined, in the manner of the circuit 1, by the values of the capacitance C' and the resistive load RL'. A suitable value for the resistance R4 is 1 Kilohm.

In the event the voltage $V_{IN}'$ in FIG. 3 is lost as a result of a short circuit condition, that is, the input terminal 2' is placed at ground potential, the resistance R3' is shorted to ground potential. However, because of the presence of the resistance R4 in the circuit, a resistive path still exists by which the capacitance C' can discharge to ground potential and establish an output pulse of a finite duration. In this case, the output pulse produced at the output terminal 3' and shown in FIG. 5 is expressed as in (5), supra, where $$T = C' \frac{R2'R4RL'}{R2'RL' + RL'R4 + R2'R4} \quad (7)$$

Again, if the values of the resistances R2' and R4 are both very much larger than the value of the resistive load RL', T in expression (7) has a value, as before, essentially equal to C'RL'.

Figure 6:
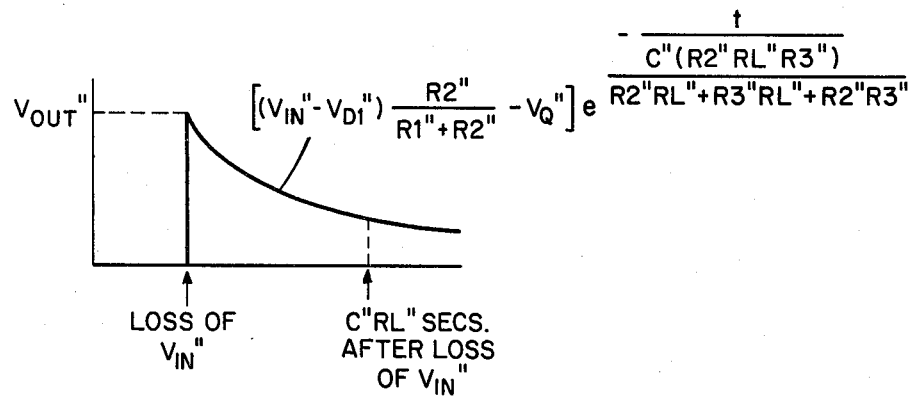

The voltage and monitoring circuit 12 as shown in FIG. 4 differs from the voltage and monitoring circuit 1 as shown in FIG. 1 in that it utilizes an additional diode D3 (e.g. of a type 1N4148) connected to the input terminal 2" and to the juncture of the diode D2" and the resistance R3". In the event of a loss of the input voltage $V_{IN}''$ due to an open circuit condition, the anode of the diode D3 is open circuited but the operation of the circuit 12 is otherwise the same as that of the aforedescribed circuit 1. Thus, an output pulse as shown in FIG. 6 is produced at the output terminal 3'' having a maximum value $V_{OUT}''$ at the time of the loss of voltage expressed by $$V_{OUT}' = \left( (V_{IN}'' - V_{D1}'') \frac{R2''}{R1'' + R2''} - V_Q'' \right) e^{-\frac{t \cdot C''(R2''RL''R3'')}{R2''RL'' + R3''RL'' + R2''R3''}} \quad (8)$$

Again, for large values for the resistances R2'' and R3'' relative to the resistive load RL'', the exponential portion of expression (8) is essentially equal to $$e^{-\frac{t}{C''RL''}}.$$

In the event the input voltage $V_{IN}''$ in FIG. 4 is lost as a result of a short circuit condition, the anode of the diode D3 is placed at ground potential but the circuit is otherwise unchanged. Upon the loss of the voltage $V_{IN}''$, the capacitance C'' is still able to discharge through the diode D2'' and the resistance R3'' to ground potential and an output pulse as shown in FIG. 6 and expressed in (8) supra is produced at the output terminal 3''. The diode D3 is poled in this situation to be reverse biased to the flow of current to ground potential.

While there have been described what are considered to be preferred embodiments of the invention, it will be apparent to those skilled in the art that various changes and modifications may be made therein without departing from the invention as called for in the appended claims.

What is claimed is:

1. A voltage monitoring and indicating circuit, comprising:
   an input terminal for receiving an input voltage;
   an output terminal;
   transistor means having a first electrode, a second electrode, and a third electrode coupled to the output terminal, said transistor means having a first conducting state during which no voltage is produced at its third electrode and at the output terminal and a second conducting state during which a voltage pulse is produced at its third electrode and at the output terminal;
   storage means coupled to the first electrode of the transistor means;
   circuit means coupled to the input terminal, to the storage means, and to the transistor means, said circuit means comprising:
   first resistance means coupled in a series path between the input terminal and the first electrode of the transistor means;
   a source of reference potential;
   second resistance means coupled in parallel with the storage means and between the juncture of the first resistance means and the first electrode of the transistor means and the source of reference potential; and
   discharge means coupled to the second electrode of the transistor means, to the input terminal, and to the source of reference potential;
   said circuit means being operative when an input voltage is present at the input terminal to cause the storage means to be charged to a voltage and to cause the transistor means to operate in its first conducting state whereby no voltage is produced by the transistor means at its third electrode and at the output terminal;
   said storage means being operative when it has been charged to a voltage by the circuit means and in response to a subsequent loss of the input voltage at the input terminal to discharge and to cause the transistor means to operate in its second conducting state, whereby an output pulse indicative of the loss of the input voltage is produced at the third electrode of the transistor means and at the output terminal; and
   said discharge means of the circuit means including third resistance means coupled to the second electrode of the transistor means, to the input terminal, and to the source of reference potential, and being operative when the transistor means is in its second conducting state to provide a discharge path through the transistor means for the storage means, the output pulse produced by the transistor means being produced during the discharge of the storage means.

2. A voltage monitoring and indicating circuit in accordance with claim 1 wherein:
   the circuit means further comprises:
   diode means coupled in a series path with the input terminal and the first resistance means, said diode means being operative when an input voltage is present at the input terminal to be biased in a forward direction to allow the storage means to be charged via the first resistance means to a value of voltage related to the value of the input voltage, and operative in response to a subsequent loss of the input voltage to prevent a discharge of the storage means in the direction of the input terminal.

3. A voltage monitoring and indicating circuit in accordance with claim 2 wherein:
   the storage means includes a capacitance; and
   the transistor means includes a transistor having emitter, base and collector electrodes corresponding, respectively, to the first, second and third electrodes.

4. A voltage monitoring and indicating circuit in accordance with claim 3 wherein:
   the input terminal is arranged to receive a positive dc voltage; and
   the transistor is a pnp transistor.

5. A voltage monitoring and indicating circuit in accordance with claim 1 wherein:
   the discharge means further includes diode means coupled between the second electrode of the transistor means and the juncture of the third resistance means and the input terminal, said diode means being reverse biased to an input voltage present at the input terminal and operative in the event of a subsequent loss of the input voltage due to an open circuit condition to be forward biased in a direction to permit discharge of the storage means therethrough and through the third resistance means to the source of reference potential.

6. A voltage monitoring and indicating circuit in accordance with claim 5 wherein:
   the storage means includes a capacitance connected in parallel with the second resistance means; and
   the transistor means includes a transistor having emitter, base and collector electrodes corresponding, respectively, to the first, second and third electrodes.

7. A voltage monitoring and indicating circuit in accordance with claim 6 further comprising:
a resistive load coupled to the output terminal;
and wherein
the second and third resistance means and the resistive load are selected to have resistance values so that the duration of an output pulse produced by the transistor at its collector electrode and at the output terminal is determined principally by the value of the capacitance and the resistance value of the resistive load.

8. A voltage monitoring and indicating circuit in accordance with claim 7 wherein:
the input terminal is arranged to receive a positive dc voltage; and
the transistor is a pnp transistor.

9. A voltage monitoring and indicating circuit in accordance with claim 1 wherein:
the discharge means further includes fourth resistance means coupled between the second electrode of the transistor means and the juncture of the third resistance means and the input terminal, said fourth resistance means being operative in the event of a loss of an input voltage at the input terminal due to an open circuit condition and with the transistor means is in its second conducting state to provide a discharge path therethrough and through the third resistance means to the source of reference potential, and further operative in the event of a loss of an input voltage at the input terminal due to a short circuit condition which places the input terminal at the source of reference potential, and with the transistor means in its second conducting state, to provide a discharge path therethrough and the short circuited third resistance means to the source of reference potential.

10. A voltage monitoring and indicating circuit in accordance with claim 9 wherein:
the storage means includes a capacitance connected in parallel with the second resistance means; and
the transistor means includes a transistor having emitter, base and collector electrode corresponding, respectively, to the first, second and third electrodes.

11. A voltage monitoring and indicating circuit in accordance with claim 10 further comprising:
a resistive load coupled to the output terminal;
and wherein:
the second, third and fourth resistance means and the resistive load are selected to have resistance values so that the duration of an output pulse produced by the transistor at its collector electrode and at the output terminal is determined principally by the value of the capacitance and the resistance value of the resistive load.

12. A voltage monitoring and indicating circuit in accordance with claim 1 wherein:
the discharge means further includes first and second diode means coupled in series between the second electrode of the transistor means and the input terminal, said first and second diode means being oppositely poled with respect to each other and said third resistance means being coupled between the juncture of the first and second diode means and the source of reference potential, said first diode means being operative in the event of a loss of an input voltage at the input terminal due to an open circuit condition and with the transistor means in its second conducting state to be forward biased in a direction to permit discharge of the storage means therethrough and through the third resistance means, and said first and second diode means being operative in the event of a loss of an input voltage at the input terminal due to a short circuit condition which places the input terminal at the source of reference potential, and with the transistor means in its second conducting state, to permit discharge of the storage means only through the first diode means and the third resistance means to the source of reference potential.

13. A voltage monitoring and indicating circuit in accordance with claim 12 wherein:
the storage means includes a capacitance connected in parallel with the second resistance means; and
the transistor means includes a transistor having emitter, base and collector electrodes corresponding, respectively, to the first, second and third electrodes.

14. A voltage monitoring and indicating circuit in accordance with claim 13 further comprising:
a resistive load coupled to the output terminal;
and wherein:
the second and third resistance means and the resistive load are selected to have resistance values so that the duration of an output pulse produced by the transistor at its collector electrode and at the output terminal is determined principally by the value of the capacitance and the resistance value of the resistive load.

* * * * *